United States Patent

[11] 3,634,202

[72] Inventors Pierre Michelet; Jean Joly, both of Paris, France

[21] Appl. No. 38,699
[22] Filed May 19, 1970
[45] Patented Jan. 11, 1971
[73] Assignee Societe Lignes Telegraphiques et Telephoniques Paris, France

[54] PROCESS FOR THE PRODUCTION OF THICK FILM CONDUCTORS AND CIRCUITS INCORPORATING SUCH CONDUCTORS
5 Claims, 9 Drawing Figs.

[52] U.S. Cl. .......... 204/15, 204/42
[51] Int. Cl. .......... C23b 5/48, C23b 5/46
[50] Field of Search .......... 204/15–18

[56] References Cited

UNITED STATES PATENTS

| | | | |
|---|---|---|---|
| 3,192,135 | 6/1965 | Robbins | 204/15 |
| 3,322,655 | 5/1967 | Garibotti et al. | 204/15 |
| 3,386,894 | 6/1968 | Steppat | 204/15 |
| 3,507,756 | 4/1970 | Wenger | 204/15 |

*Primary Examiner*—John H. Mack
*Assistant Examiner*—T. Tufariello
*Attorney*—Kemon, Palmer & Estabrook

ABSTRACT: The thick film conductive circuit is obtained by first depositing on a substrate a thin underlayer of a film-forming metal and secondly a thin film of the metal to constitute the pattern of the circuit which is then photoetched in said layer. The bare portion of the underlayer is then oxidized and the conductive pattern is electrolytically thickened. This process requires only one mask.

Inventors:
Pierre Michelet
Jean Joly
By Kemon Palmer & Estabrook
Attorneys

Inventors:
Pierre Michelet
Jean Joly
By Kemon Palmer & Estabrook
Attorneys

Inventors:
Pierre Michelet
Jean Joly
By Kemon, Palmer & Estabrook
Attorneys

Inventors:
Pierre Michelet
Jean Joly
By Kemon Palmer & Estabrook
Attorneys

PROCESS FOR THE PRODUCTION OF THICK FILM CONDUCTORS AND CIRCUITS INCORPORATING SUCH CONDUCTORS

BACKGROUND OF THE INVENTION

The present invention concerns an improved process for the localized deposition of thick films upon predetermined portions on a flat substrate. Such deposits are employed inter alia in the production of conductors of ultrahigh frequency circuits of the microstrip. By "thick films" are meant films whose thickness may exceed 10 microns as opposed to thin films, the thicknesses of which remain of the order of 1 micron.

PRIOR ART

Solutions to this problem have been proposed and have been briefly summarized in the article published in the magazine "Electronics," which appeared on Apr. 14, 1969, page 100, under the title "Designing lumped elements into microwave amplifiers."

Most of current processes involve the successive use of two photographic masks in the course of manufacture, which gives rise to difficulties in application and inevitably results in the introduction of misalignment due to successive positioning of different masks with respect to the same substrate. The present invention has essentially for its object to provide a process which limits the number of masks required in producing this type of circuit to only one.

SUMMARY OF THE DISCLOSURE

The present invention is essentially characterized by the following operational steps:

1. Deposition upon the substrate of a continuous thin layer of a first metal whose oxide is a dielectric.
2. Deposition of a continuous thin layer of a second metal constituting the desired conductors.
3. Selective etching of the said second metal in accordance with the desired design by a photoengraving method.
4. Partial oxidation of the metal of the first metal layer on the parts bared in the course of operation 3.
5. Electrolytic thickening of the conductive design resulting from operation 3.

In accordance with a preferred embodiment of the invention, in which an insulating substrate is employed, the first two thin layers are simultaneously produced by vacuum evaporation and/or cathode sputtering. They may be successively formed in the same vessel without breaking the vacuum. The first metal is tantalum and the second gold. The tantalum is thermally oxidized. When the substrate is conductive, the first layer of metal may be entirely oxidized, the substrate serving as the current supply electrode in the course of the electrolytic deposition. When the substrate is a dielectric the unoxidized portion of the first metal layer which lie beneath the conductive design are used as an electrode for further electrolytic thickening.

Figure 7:
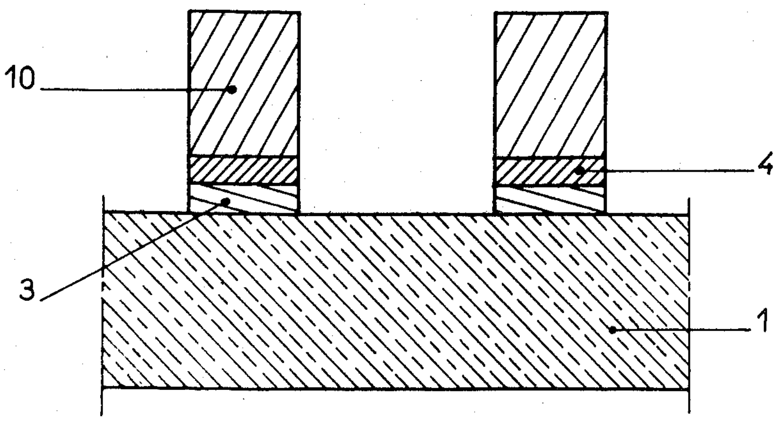
Figure 7:
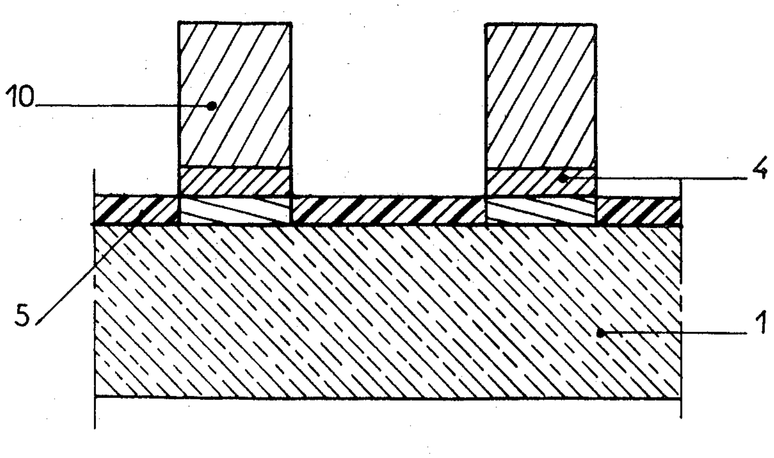
Figure 8:
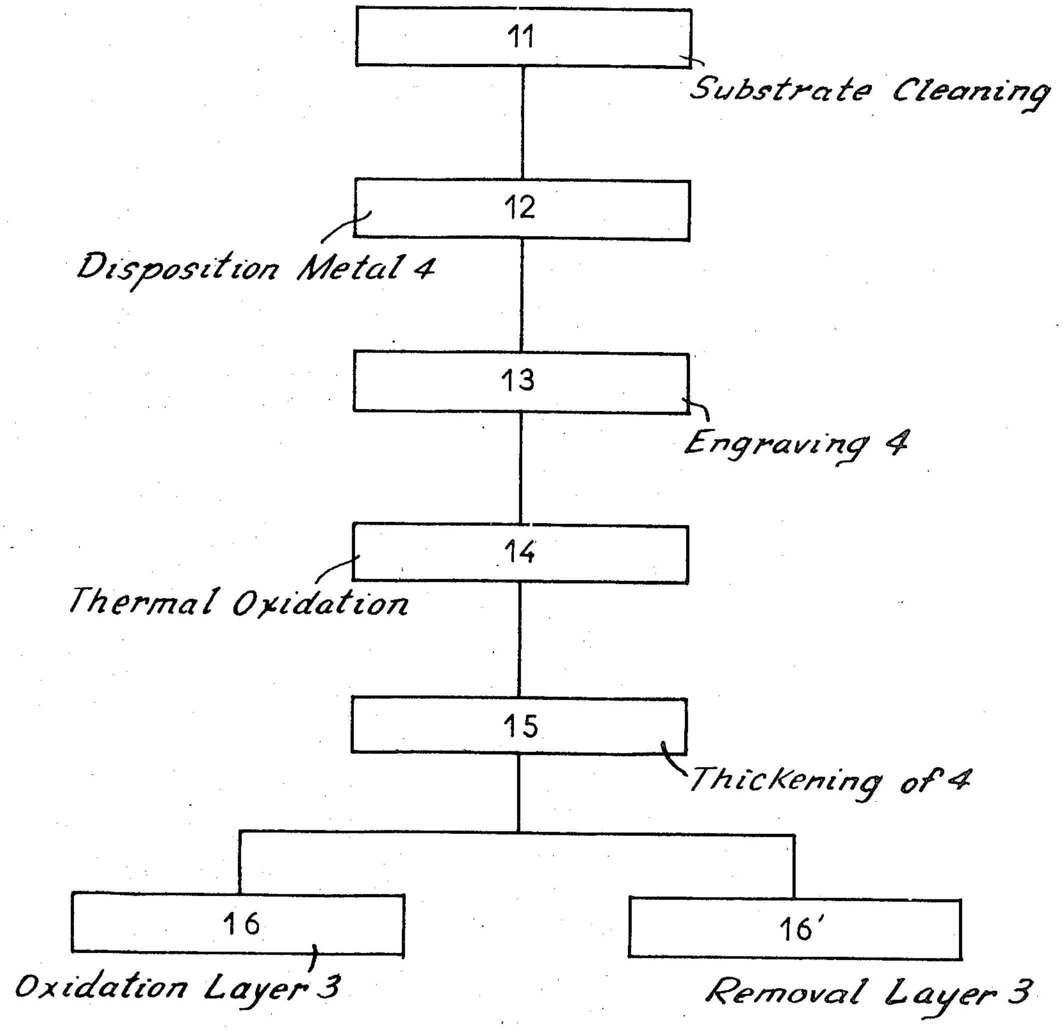

The invention will be readily understood from the following description and with reference to the accompanying drawings of a preferred embodiment of the invention given as an illustration, wherein FIGS. 1 to 8 illustrate the circuit in different stages of manufacture, and FIG. 8 is a block diagram of the process of the invention.

Figure 1:
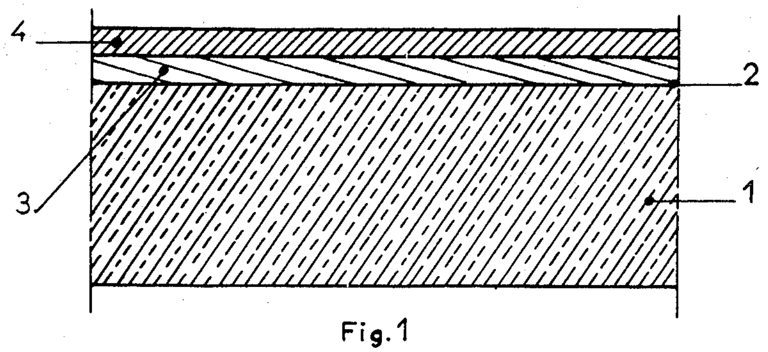

FIG. 1 shows at 1 an insulating substrate, for example of ceramics, the surface of which conforms to the conditions necessary for the adhesion of thin-layer deposits, which are well known to the person skilled in the art. It is to be understood that, in all the following figures, it has not been possible to conform to the scale of the thicknesses, since the latter cover a number of orders of magnitude. For example, the support reaches a number of millimeters. After the upper surface 2 of the support has been appropriately cleaned, a continuous first thin layer 3 (of a thickness of several tenths of a micron) is deposited, consisting of a metal whose oxide has good insulating properties under small thickness.

Figure 2:
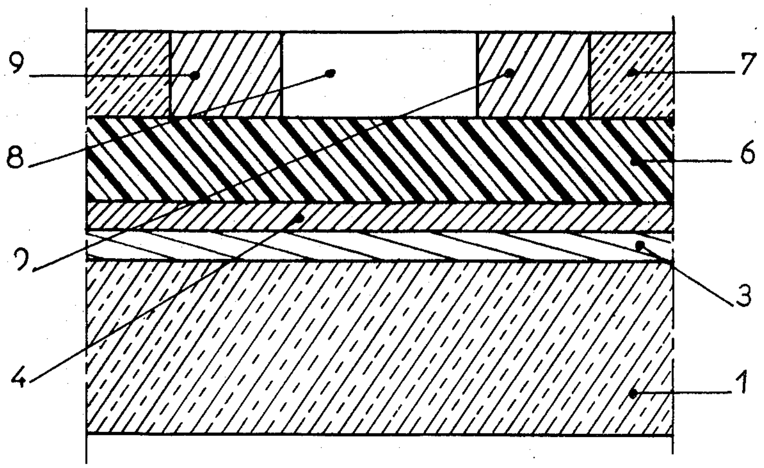
Figure 3:
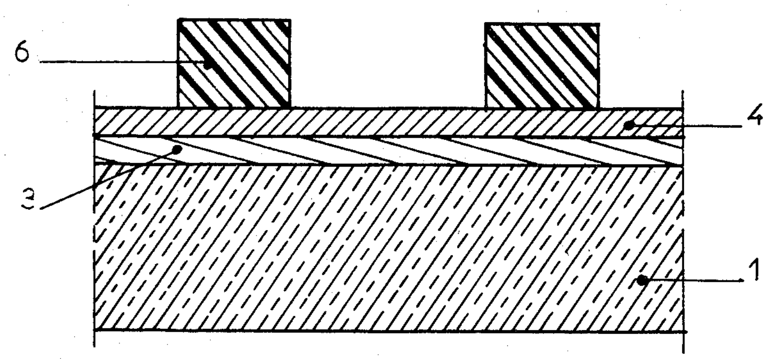
Figure 4:
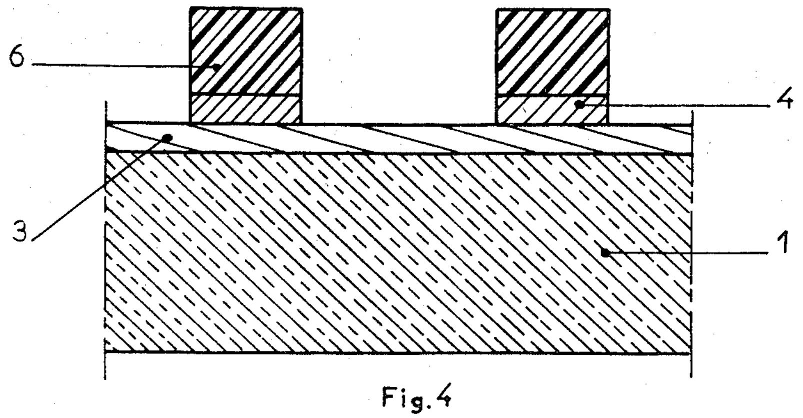

Tantalum is an example of the metal which meets the required conditions. The layer 3 of oxidizable metal is covered by a second continuous thin layer 4 of nonoxidizable metal in which the conductive design is to be produced. This metal is generally gold. The thickness of the layer 4 is of the same order of magnitude as that of the first layer 3. The two layers of metal are successively deposited by vacuum evaporation and/or cathode sputtering in the same operating setup. The desired conductor pattern is thereafter drawn on the continuous surface of the layer 4 by any method known per se, for example, by photoetching, as illustrated in FIG. 2. The whole layer 4 is covered with a layer 6 of photoresist material which is as homogeneous as possible, and there is disposed on this layer a photographic model 7 of the tracing to be reproduced, which has alternate transparent and opaque portions 8 and 9 respectively. The photosensitive layer is thereafter exposed to light through the photographic mask in the well-known manner. Depending upon the type of material employed, the nonexposed parts (or the exposed parts) become insoluble in the solvents by which this material is dissolved before exposure. For the application of the invention, the mask and the resin are so chosen that the insoluble portions of the layer 6 correspond to the tracing which it is desired to obtain. The mask 7 is thereafter removed and the soluble portions of the layer 6 are dissolved. Therefore, those portions of the layer 4 which reproduce the desired tracing are protected by the photosensitive product 6, as illustrated in FIG. 3. By chemical etching, the bared portions of the layer 4 are eliminated (FIG. 4) so as to leave only the parts of the conductive layer which constitute the circuit design. The exposed residues of the photosensitive layer 6 are thereafter eliminated for instance by immersion in acetone. The underlayer 3 is then subjected to an oxidation, for example, a thermal oxidation if the layer 3 is made of tantalum. The circuit design protect the underlaying part of layer 3 from oxidation.

Figure 5:
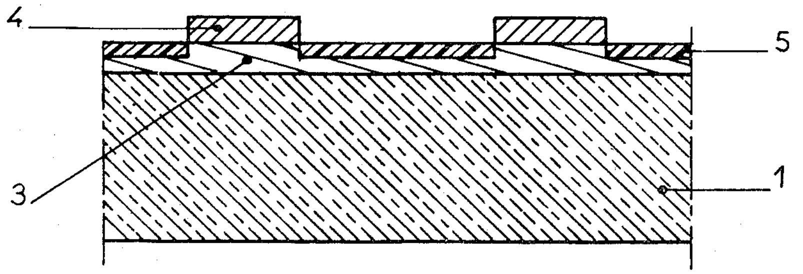
Figure 6:
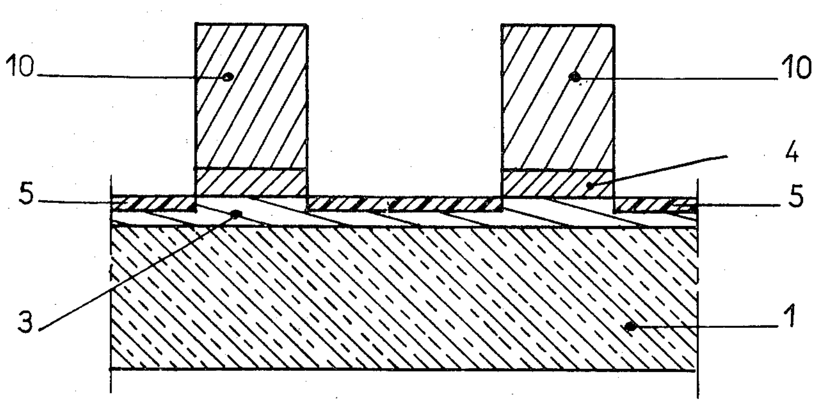

There is shown at 5 in FIG. 5 the surface oxide layer which forms on the portions which are not protected by the conductive circuit 4. The oxidation is stopped before the whole thickness of the layer 3 has been converted into oxide.

The circuit design 4 is thereafter thickened electrolytically as is the usual practice, for example in a gold chloride solution serving as electrolyte. The unoxidized part of layer 3 is employed as cathode. Since the dielectric oxide 5 prevents the passage of current between the solution and the unoxidized lower portion of the layer 3, the gold is deposited where layer 4, remains as illustrated at 10 in FIG. 6. The growth of the layer 10 is continued as a function of the characteristics of the circuit which it is desired to obtain.

There are shown in FIGS. 7 and 7′ respectively two variants of the last step of operation. In a first variant, the tantalum oxide 5 and the subjacent tantalum layer 3 are eliminated from the free surface of the substrate 1, for example, by immersion in a hydrofluoric acid solution, whereby there is obtained a network of conductors 10 on a bare insulating substrate 1. In another variant, the tantalum layer 3 is preserved, but is entirely oxidized, for example, by subsequent thermal treatment of the tantalum after deposition of the conductors 10. The tantalum oxide 5 is transparent and behaves as a protective insulating layer on the substrate 1, whereby the various conductors 10 are insulated.

The sequence of operations for carrying out the process of the invention is summarized in the block diagram of FIG. 8 There is shown at 11 the preparation of the substrate for enabling the thin film of oxidizable metal to be deposited. The successive depositions of the layers 3 and 4 (oxidizable metal and noble metal constituting the conductors) are carried out in the course of a single operation in vacuo 12. The photoengraving steps applied to the thin layer 4 are combined in 13. The operating stage 14 consists of the partial thermal oxidation of the bared portions of the layer of oxidizable metal 3. The succeeding operation 15 consists in the selective electrolytic enrichment of the conductor tracing etched by photogravure (stage 13). The layer 3 is thereafter completely oxidized (stage 16), or is eliminated (stage 16′).

What we claim:

1. A process for the manufacturing of thick film conductive circuits on an insulating substrate comprising the following steps:
   - cleaning said substrate;
   - vacuum depositing first a thin underlayer of an oxidizable metal and second a thin layer of a conductive metal;
   - photoengraving said thin layer so as to produce the pattern of the circuit;
   - partially oxidizing the parts of the underlayer which are not covered by said pattern;
   - electrolytically thickening said pattern;

2. A process for the manufacturing of thick film conductive circuits on an insulating substrate according to claim 1 comprising the following further step:
   - terminating the oxidation of said underlayer part uncovered by the conductive pattern.

3. A process for the manufacturing of thick film conductive circuits according to claim 1 comprising the following further step:
   - removing the parts of the partially oxidized layer uncovered by said conductive pattern.

4. A process for the manufacturing of thick film conductive circuits on a conductive substrate comprising the following steps:
   - cleaning said substrate;
   - vacuum depositing first a thin underlayer of an oxidizable metal and second a thin layer of a conductive metal;
   - photoengraving said thin conductive layer so as to produce the pattern of the circuit;
   - oxidizing the parts of the underlayer uncovered by said pattern;
   - electrolytically thickening said pattern.

5. A thick film conductive circuit manufactured according to claim 1 in which said substrate is of ceramics, said underlayer of tantalum, said layer of gold.

* * * * *

UNITED STATES PATENT OFFICE
CERTIFICATE OF CORRECTION

Patent No. 3,634,202 Dated January 11, 1971

Inventor(s) Pierre Michelet

It is certified that error appears in the above-identified patent and that said Letters Patent are hereby corrected as shown below:

Column 1, line 9 -- cuits of the microstrip. By "thick films" are meant films whose replace with:

cuits of the microstrip type. By "thick films" are meant films whose

Signed and sealed this 4th day of July 1972.

(SEAL)
Attest:

EDWARD M.FLETCHER, JR.
Attesting Officer

ROBERT GOTTSCHALK
Commissioner of Patents